United States Patent [19]

Ogoshi

[11] Patent Number: 5,426,007
[45] Date of Patent: Jun. 20, 1995

[54] PHOTOMASK AND PROCESS OF MAKING SEMICONDUCTOR DEVICE BY THE USE OF THE PHOTOMASK

[75] Inventor: Ken Ogoshi, Suwa, Japan

[73] Assignee: Seiko Epson Corporation, Tokyo, Japan

[21] Appl. No.: 79,264

[22] Filed: Jun. 21, 1993

[30] Foreign Application Priority Data

Jun. 25, 1992 [JP] Japan .................................. 4-167845
Apr. 22, 1993 [JP] Japan .................................. 5-119136

[51] Int. Cl.6 .............................................. G03F 9/00
[52] U.S. Cl. .......................................... 430/5; 430/321; 430/322
[58] Field of Search ........................... 430/5, 322, 321

[56] References Cited

U.S. PATENT DOCUMENTS 4,393,127  7/1983  Greschner et al. ...................... 430/5

FOREIGN PATENT DOCUMENTS 3-215861  9/1991  Japan .

OTHER PUBLICATIONS

Eugene Hecht, *Optics,* May, 1990, Chapter 6, pp. 226–230.

*Primary Examiner*—S. Rosasco
*Attorney, Agent, or Firm*—Oliff & Berridge

[57] ABSTRACT

A photomask includes square holes formed therein, each of the square holes having sides each of which is located to be parallel or perpendicular to a straight line radially extending between the center of the photomask corresponding to the center of a lens and the center of that hole. By forming the holes in such a manner, the sides of the holes are located in the tangential or sagittal plane such that the effect of aberration can be minimized.

20 Claims, 8 Drawing Sheets

PHOTOMASK AND PROCESS OF MAKING SEMICONDUCTOR DEVICE BY THE USE OF THE PHOTOMASK

BACKGROUND OF THE INVENTION

1. Field of the Invention

The present invention relates to a photomask for forming holes in making a semiconductor device at the exposure step and a process of making a semiconductor device by the use of the photomask.

2. Description of the Related Art

Recently, a process rule for semiconductor device is increasingly refined, accompanied by a number of new techniques. In the photographing step, that portion of the process until the process rule on the level of submicron has been constructed in accordance with the g-ray exposure technique. However, another exposure technique using an i-ray of shorter wavelength is now being introduced accompanied by the shift of the process to halfmicron. Further, the developing step takes a post-exposure bake for purposes of reducing the standing waves and so on.

On advancing the refinement of the process rule for semiconductor device, it becomes impossible to neglect the diffraction of the exposure light. It is thus required to provide a photomask dealing with the diffraction.

FIGS. 10A to 10G are diagrammatic views illustrating a conventional pattern of resist to be produced, a photomask for the resist pattern while dealing with the diffraction and patterns of resist formed by the use of the above photomask, respectively. The resist pattern of FIG. 10A includes a central hole and four corner holes formed therein. In order to obtain such a hole pattern, such a photomask as shown in FIG. 10B is used while considering the diffraction of light. More particularly, the photomask includes five square holes corresponding to the five holes in the resist pattern, these five square holes being intended to provide circular holes in the resist due to the fact that the light passed through the square holes in the photomask is diffracted.

Where a spherical lens is used in an optical stepper, however, the aforementioned photomask is undesirably influenced by an aberration on exposure. Exact hole patterns may not be obtained by the photomask. More particularly, each of the corner holes in the resist of FIG. 10C may be formed to be of an elliptical configuration extending radially from the center of the resist. This may adversely affect various characteristics of the semiconductor device produced.

The degree of integration in the semiconductor device can be increased by the refinement of the process rule for semiconductor device, and the size of chip of the semiconductor device tends to be increased. In order to make a chip of such an increased size, the optical stepper will be required to have a broader exposure area. If the mass-production is considered, similar requirements are also in the process rule of the prior art.

In order to enlarge the exposure area of the optical stepper, it requires an optical system using a lens assembly of larger aperture, accompanied by various aberrations that are created in the resist at the corners and marginal edges thereof.

In general, the problem of aberration can sharply be overcome if the aperture of a lens assembly used in the reduction exposure device is very largely increased while only using the central portion of such a lens assembly. In the reduction exposure device, however, the magnitude of the lens assembly is limited. Therefore, the aberration was intended to be reduced by utilizing a combination of convex and concave lenses as in the general optical system. However, a manner of combining these lenses is also limited. The prior art cannot necessarily eliminate the influence of the aberration.

Accordingly, the prior art provided a resist having holes of forms very different from the circles at the regions of the resist corresponding to the marginal edge of the lens. The precision is deteriorating at the hole portions in the etching, post-etching CVD or spatter step. This may adversely affect various characteristics of the semiconductor device.

SUMMARY OF THE INVENTION

It is therefore an object of the present invention to provide a photomask and a process of making a semiconductor device by the use of such a photomask which can improve the precision of holes with respect to their configuration when the holes are to be formed on the semiconductor device in an optical stepper.

To this end, the present invention provides a photomask for forming circular holes in a resist through an optical stepper, said photomask having holes of substantially square configuration at positions respectively corresponding to the circular holes, each of the sides of said square holes being inclined to be parallel or perpendicular to a straight line connecting the center of said photomask on the optical axis to the center of each of said square holes.

The present invention also provides a process of making a semiconductor device by the use of a photomask for forming circular holes in a resist through an optical stepper, said photomask having holes of substantially square configuration at positions respectively corresponding to the circular holes, each of the sides of said square holes being inclined to be parallel or perpendicular to a straight line connecting the center of the photomask located on the optical axis to the center of each of said square holes.

If the spherical surface of a lens used for exposure with demagnification is considered, therefore, each of the sides of the substantially square holes will belong only to the tangential or sagittal plane of the sphere. The effect of aberration in the spherical lens can be minimized.

Furthermore, the present invention provides a photomask for forming circular holes in a resist through an optical stepper, said photomask having holes of substantially square configuration at positions respectively corresponding to the circular holes, each of the sides of said square holes being stepwise inclined to be substantially parallel or perpendicular to a straight line connecting the center of said photomask located on the optical axis to the center of each of said square holes.

Furthermore, the present invention provides a process of making a semiconductor device by the use of a photomask for forming circular holes in a resist through an optical stepper, said photomask having holes of substantially square configuration at positions respectively corresponding to the circular holes, each of the sides of said square holes being stepwise inclined to be substantially parallel or perpendicular to a straight line connecting the center of the photomask located on the optical axis to the center of each of said square holes.

If the spherical surface of a lens used for exposure with demagnification is considered, each of the sides of the substantially square holes will belong only to the tangential or sagittal plane of the sphere. The effect of aberration in the spherical lens can be minimized.

By using the photomask of the present invention when the semiconductor device is produced by exposure with demagnification, the hole can be formed with reduction of the effect of aberration in the lens.

When each of the sides of the substantially square holes in the photomask are located to belong to the tangential or sagittal plane of the spherical lens, the precision in the configuration of the holes formed in the semiconductor device can be improved with less influence of the aberration in the lens.

DETAILED DESCRIPTION OF THE PREFERRED EMBODIMENTS

First Embodiment

Figure 1:
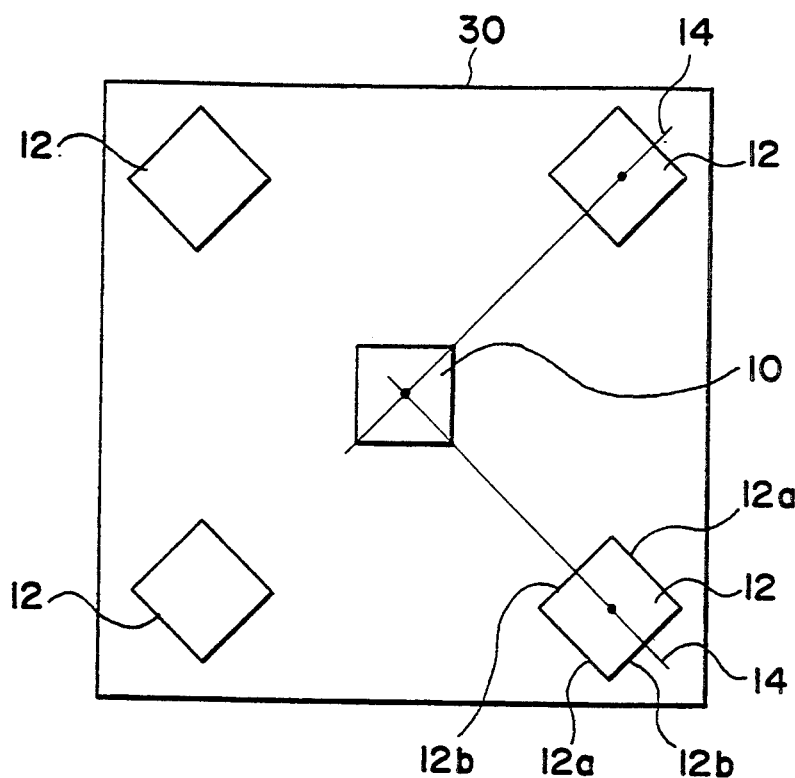
FIG. 1 is a view of one embodiment of a photomask constructed in accordance with the present invention.

FIG. 1 diagrammatically shows one embodiment of a photomask 30 constructed in accordance with the present invention. The photomask 80 is of quadrangle configuration and includes a central hole 10 and four holes 12 located at four corners or at the opposite ends of two diagonals in the photomask 30.

The central hole 10 is of substantially square configuration and located on the optical axis of an optical system that will be described later. Each of the four holes 12 is of substantially square configuration and has two pairs of opposed sides, each pair of opposed sides being located substantially parallel or perpendicular to the corresponding diagonal in the quadrangle photomask 30.

The sides of each of the square holes 12 of substantially square configuration (including quadrilaterals such as square, rectangle, rhombus and so on) substantially parallel to the corresponding diagonal of the photomask 30 are preferably 0.8–1.0 times and more preferably 0.9–1.0 times as long as the sides of the same hole 12 substantially perpendicular to the same diagonal. This is because the effect of aberration cannot completely be eliminated although it can be minimized by the formation of the holes 12 as shown in this embodiment. The difference of length between the two pairs of opposed sides in each of the holes 12 serves to form holes of more completely circular configuration in the resist with less affection of the aberration. The difference of length may be determined depending on the remaining effect of aberration.

Figure 2:
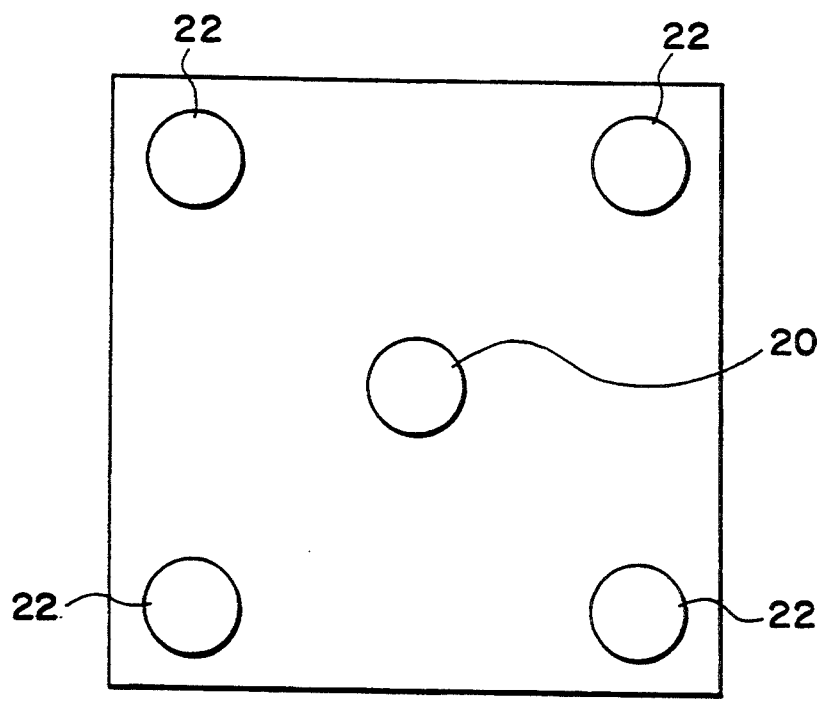
FIG. 2 is a view of patterns formed in the resist of the semiconductor device when an exposure with demagnification is carried out by using the photomask shown in FIG. 1.

FIG. 2 shows a pattern formed in the resist on the semiconductor device when the photomask 30 shown in FIG. 1 is used for exposure with demagnification. As shown, the use of the photomask 30 shown in FIG. 1 permits holes to be formed into substantially circular configuration even though they are located at positions remote from the optical axis. The details thereof will be described later.

Figure 3:
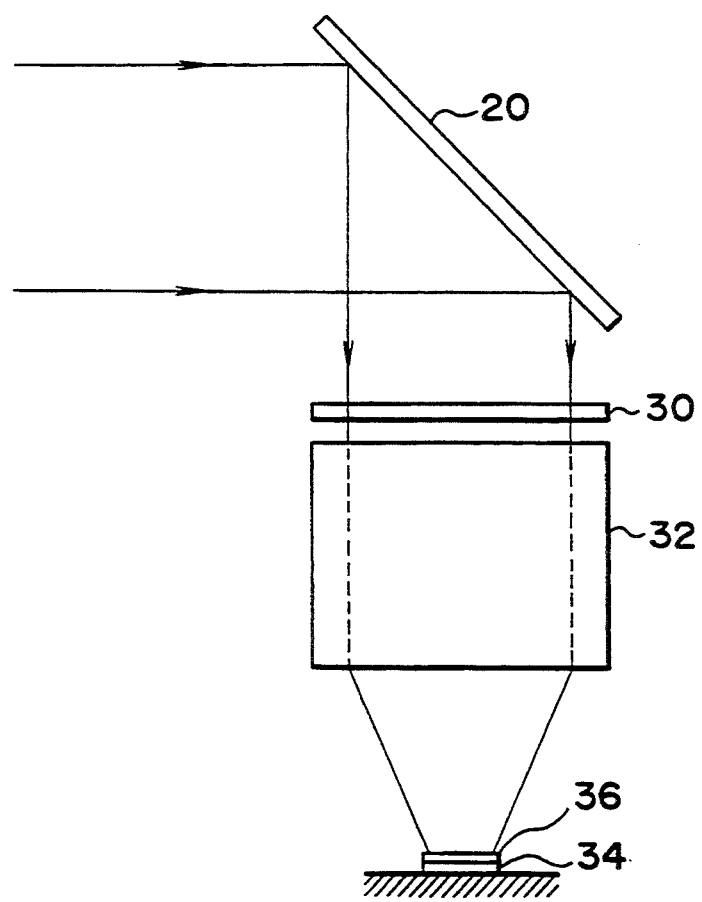
FIG. 3 is a schematic view of a semiconductor producing system in which the exposure with demagnification is performed by the use of the photomask shown in FIG. 1.

FIG. 3 shows a system for performing the exposure with demagnification by the use of the photomask 30 shown in FIG. 1, the geometrical arrangement of the optical stepper mainly including the photomask 30 and an optical system 32 and so on being schematically shown herein.

The optical stepper comprises a reflector 20 for reflecting parallel rays from a source of light, the photomask 30 for permitting the partial transmission of the reflected parallel rays, an optical system 32 comprising a convex lens, and a semiconductor device 34 having a resist 36 located thereon. Parallel rays from the source of light are reflected toward the photomask 30 by the reflector 20. After passed through the photomask 30, the parallel rays are condensed by the optical system 32 and then conducted onto the resist 36 on the semiconductor device 34.

Figure 4:
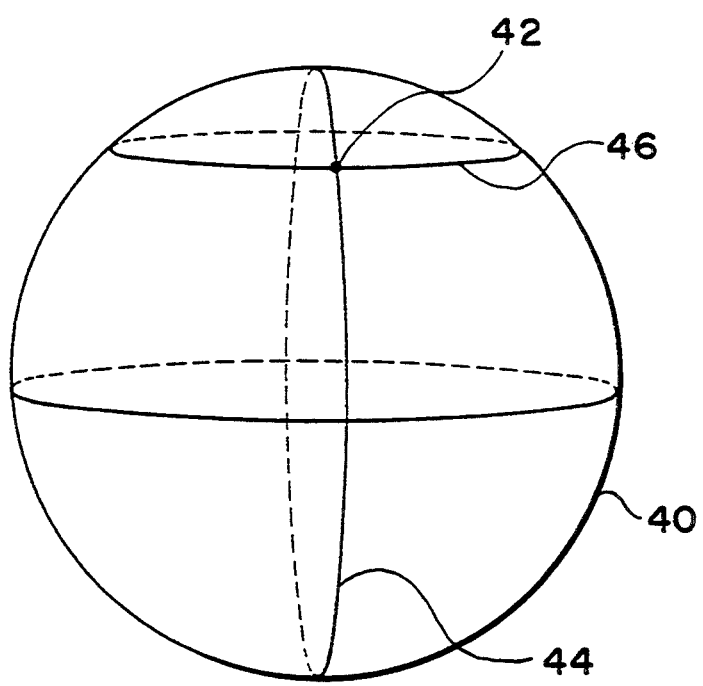
FIG. 4 is a view illustrating the principle of the aberration created about the marginal edge of the general optical lens.

Due to the property of waves, a diffraction of light passing through a fine pattern is unvoidable. The present level of technique cannot neglect such a diffraction. Thus, the substantially square hole pattern on the photomask 30 shown in FIG. 1 will create the substantially circular hole pattern on the resist 86 of FIG. 2. This results from the following reasons:

FIG. 4 is a view illustrating the principle of an aberration created about the marginal edge of the conventional spherical lens. As shown, the spherical lens has its surface of the same curvature as in part of the sphere, except any specific lens such as aspherical lens.

In FIG. 4, a sphere 40 has the same curvature as in one face of a convex lens. The curvature of the peripheral portion 42 can be analyzed into the curvatures of the tangential and sagittal planes 44 and 46. Since an imagery formed through the curvature of the meridional plane 44 is different from another imagery formed through the sagittal plane 46, phenomena created through various aberrations are in the imaging plane. Particularly, astigmatism, curvature of field and coma greatly depend on the aforementioned difference of curvature.

Figure 5A:
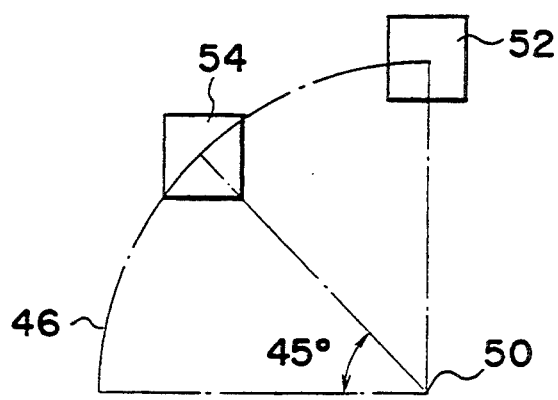
FIGS. 5A to 5C illustrate a case where the principle of the aberration shown in FIG. 4 is applied to an actual photomask.
Figure 5B:
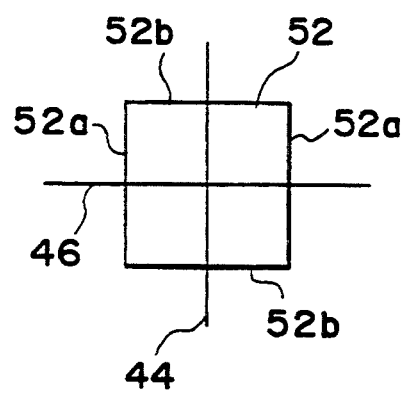
Figure 5C:
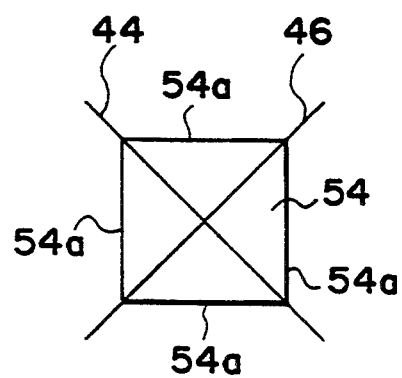

FIGS. 5A to 5C illustrate square patterns on an actual photomask when the principle of aberration shown in FIG. 4 is applied.

It is now assumed that square patterns corresponding to those of the photomask are located at positions spaced away from the center of a lens by a constant distance and that there is a horizontal line which passes through a lens center 50, as shown in FIG. 5A. A line connecting the center of a square pattern 52 to the lens center 50 is perpendicular to the horizontal line. Another line connecting the center of the other square pattern 54 to the tens center 50 is inclined relative to the horizontal line by 45 degrees.

The imagery of two square patterns 52 and 54 imaged on the semiconductor device will be described.

FIG. 5B shows the square pattern 52 located in the vertical direction to the lens center 50. As shown, the vertical sides 52a of the square pattern 52 belong to the sagittal plane 46 shown in FIG. 4 while the horizontal sides 52b thereof belong to the tangential plane 44. Thus, the vertical sides 52a of the square pattern 52 will be influenced only by the aberration in the sagittal plane 46 of the optical lens. Similarly, the horizontal sides 52b will be affected only by the aberration in the tangential plane 44 of the optical lens. In other words, the vertical and horizontal sides 52a and 52b will independently be influenced by the aberrations.

FIG. 5C shows the square pattern 54. Unlike the square pattern 52, the square pattern 54 has its four sides 54a all of which belong to both the tangential and sagittal planes 44 and 46. Therefore, each of the sides 54a of the square pattern 54 will be affected by the aberrations in both the tangential and sagittal planes 44 and 46.

As can be seen from FIG. 4, the tangential and sagittal planes 44 and 46 are of similar curvature. Thus, the sides 54a of the square pattern 54 located in the direction of 45 degrees to the lens center 50 will be more influenced by the aberrations than the sides 52a and 52b of the square pattern 52 located in the vertical direction to the lens center 50. The square pattern 54 will further be affected by the aberrations since it has a width gradually decreasing toward the center 50 of the lens.

As will be apparent from the foregoing, the holes on the photomask which have their sides more inclined relative to the tangential and sagittal planes 44 and 46 will be more affected by the aberrations when the hole patterns are located nearer the peripheral portion of the lens or photomask. This results from the fact that the difference in the curvature of the tangential and sagittal planes 44 and 46 increases toward the peripheral portion of the lens so that the affection of the astigmatism, curvature of field and coma increases.

The present invention is characterized by the fact that the aforementioned affection of aberration can be minimized. More particularly, the holes 12 of substantially square configuration in the photomask 30 shown in FIG. 1 are formed so that each of the sides will belong to only one of the tangential and sagittal planes 44 and 46 shown in FIG. 4. In other words, when there is a straight line 14 connecting the center of the photomask to each center of the holes 12, each hole 12 is formed so that each of the sides is located parallel or perpendicular to the straight line 14. Accordingly, two sides 12a located parallel to the straight line 14 will belong to only the sagittal plane 46 while two sides 12b perpendicular to the straight line 14 will belong to only the tangential plane 44. In such a manner, the affection of aberration can be minimized to form the holes in the resist on the substrate in substantially circular configuration, as shown in FIG. 2.

When the photomask of the prior art as well as the photomask 30 of the present invention are actually used to perform the exposure with demagnification, holes formed on semiconductor devices had the following sizes:

| Target Size | Photomask of the Prior Art | Photomask of the Present Embodiment |
|---|---|---|
| 0.60 μm | 0.64/0.57 | 0.61/0.59 |
| 0.55 μm | 0.58/0.53 | 0.56/0.54 |
| 0.50 μm | 0.53/0.48 | 0.51/0.49 (major axis/ minor axis) |

As will be apparent from the above table, the photomask 30 of the present embodiment can form holes of more truly circular configuration than those formed by the use of the prior art photomask. This reduces the affection of aberration. Speaking more exactly, the affection of aberration cannot completely be eliminated since the curvature of the tangential plane 44 is different from that of the sagittal plane 46. In the present embodiment, however, the affection of aberration can be suppressed to such a degree that it can almost be neglected.

Figure 6:
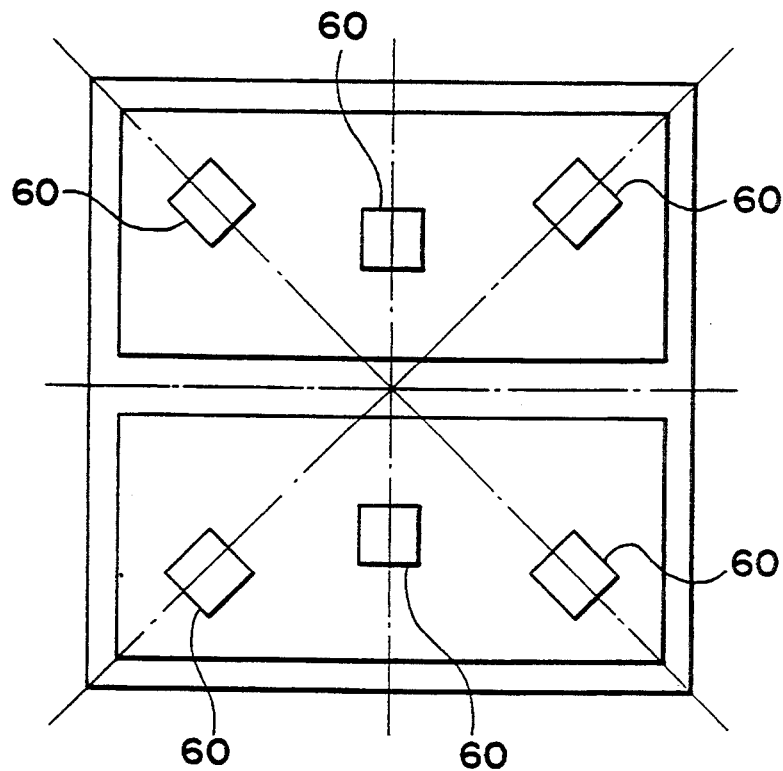
FIG. 6 is a view of a photomask having a plurality of chips and applied to the conventional semiconductor productions.

FIG. 6 is a diagrammatical view of a photomask having a plurality of chips and used in the conventional semiconductor producing systems.

Holes 60 of substantially square configuration are formed on each of the chips and have sides each of which is located parallel or perpendicular to a straight line connecting the center of the photomask, which corresponds to the center of the lens, to the center of each of the holes 60. This is similar to that of the photomask shown in FIG. 1 and will not particularly be affected by the number of chips used in the photomask.

Figure 7:
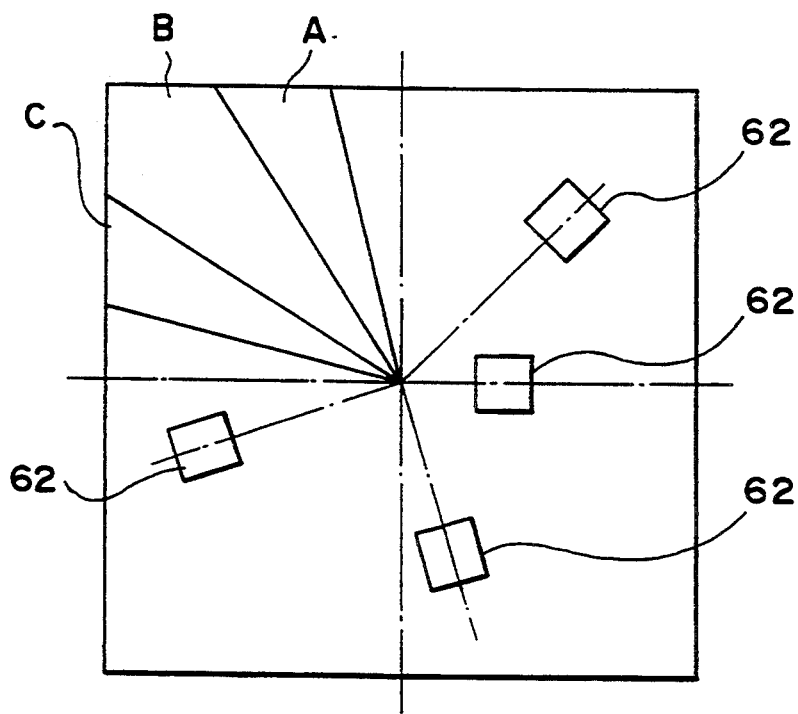
FIG. 7 further generally illustrates the photomask shown in FIGS. 1 or 6.

FIG. 7 further generally illustrates the photomask shown in FIG. 1 or 6. As shown, each of square holes 62 formed in the photomask has sides each of which is located parallel or perpendicular to the corresponding one of radial lines connecting the center of the photomask, which corresponds to the center of the lens, to the centers of the respective holes 62. In other words, each of the holes 62 has sides rotated about the center of that hole 62 by an inclination in the line connecting the center of the photomask to the center of the hole 62.

In such a manner, the sides of the hole patterns 62 will be only in the tangential or sagittal plane 44 or 46 of FIG. 4. Therefore, the affection of aberration can be minimized.

When the holes of substantially circular configuration are formed in a resist to relieve the affection of the optical aberrations in the lens, the etching can be carried out more stably in shape through the entire exposure area. Thus, the precision in the holes can be improved after the subsequent film forming step (CVD or spatter). Consequently, the semiconductor device can have its very improved reliability.

According to the present invention, each of the sides in the holes of substantially square configuration may be stepwise inclined relative to the vertical axis to be located substantially along the aforementioned radial lines in a photomask. As viewed in the second quadrant of FIG. 7, for example, each of the sides of a hole having its center located in an area A is inclined 22.5 degrees relative to the vertical axis; each of the sides of a hole having its center located in an area B is inclined 45 degrees relative to the vertical axis; and each of the sides of a hole having its center located in an area C is inclined 67.5 degrees relative to the vertical axis. When the holes are inclined stepwise in such a manner, the amount of data to be processed can be reduced.

Second Embodiment

Referring to FIGS. 8A–8F, there are shown six modifications of a photomask in the second embodiment characterized by that some of substantially square holes are inclined depending on positions in which they are to be formed.

Figure 8A:
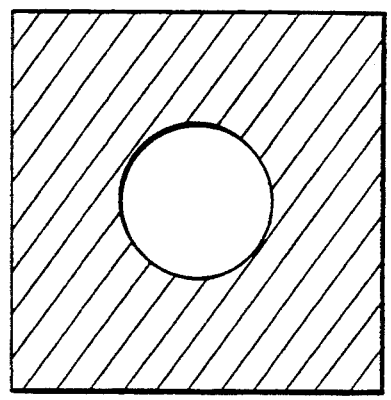
FIGS. 8A to 8F illustrate various modifications in the second embodiment of a photomask constructed in accordance with the present invention.

In a photomask of FIG. 8A, holes located spaced away from the center of the photomask within a given distance are formed to have sides each of which is parallel to any horizontal or vertical axis (which are respectively transverse and longitudinal as viewed in case of the second embodiment shown in FIGS. 8A–8F). This is because light passed through a hole close to the center of the photomask will also pass through a position close to the center of the lens, so that the light will not substantially be affected .by the aberration without particular need of considering the inclination of the hole.

On the other hand, a hole located at a position out of the given distance from the center of the photomask has sides each of which is inclined to be parallel or perpendicular to a straight line radially extending from the center of the photomask to the center of the hole as in the first embodiment or stepwise inclined to be substantially parallel or perpendicular to the above straight line.

When areas where the inclination of hole is not required to be considered are partially provided, the amount of data to be processed in automation can be reduced.

Figure 8B:
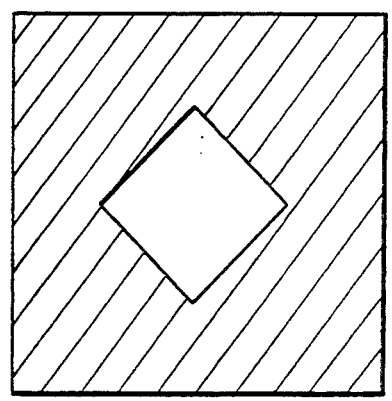

A photomask shown in FIG. 8B is characterized in that areas in which the inclination of hole is not required to be considered are rhombus, rather than being circular. The reduction of data to be processed can be carried out as in the photomask of FIG. 8A.

Figure 8C:
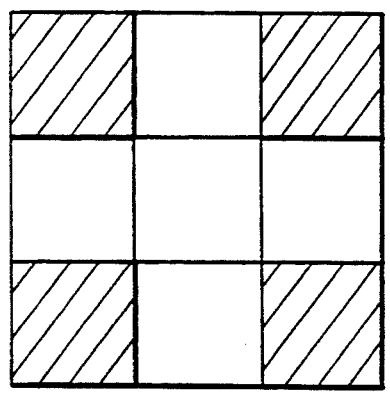

FIG. 8C shows a photomask divided into nine sections of square configuration. Among these sections, four corner sections have inclined holes formed therein. This results from the fact that in the other sections adjacent the horizontal and vertical axes passing through the center of the photomask shown in FIG. 8C, each of the sides in a hole is located to be parallel or perpendicular to the corresponding straight line passing through the center of that hole pattern, so that the inclination of hole is not particularly required to be considered along the radial line extending from the center of the photomask to the center of the hole. Therefore, a hole may be inclined only in each of the corner sections, as in the first embodiment. When such a photomask is used, the area in which holes to be considered in inclination are present are reduced 4/9 times that of the first embodiment, so that the amount of data to be processed and time required to process data can greatly be reduced.

Figure 8D:
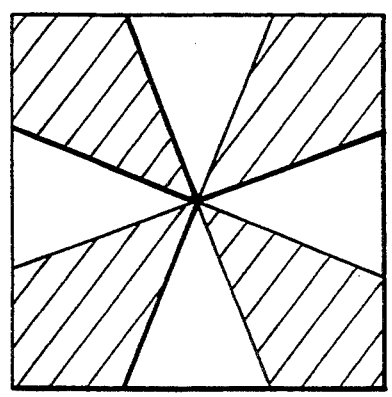
Figure 8E:
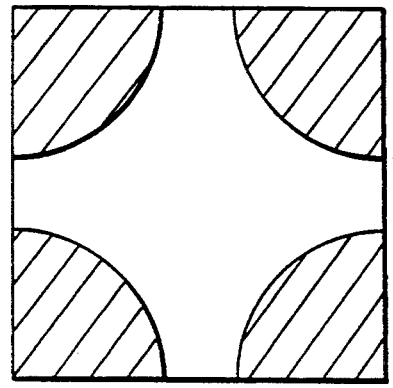
Figure 8F:
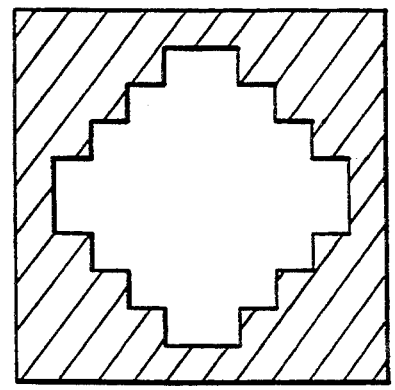

FIG. 8D shows the case where holes are inclined in sections other than sections adjacent the horizontal and vertical axes passing through the center of a photomask as in FIG. 8C. FIG. 8E shows the case where holes are inclined only within a given distance from each of the four corners in a square photomask. FIG. 8F shows the case where sections in which holes are inclined are stepwise separated from sections in which holes are not inclined. The photomasks shown in FIGS. 8E and 8F may be selectively used in view of ease calculation, depending on a manner of indication of coordinates specifying a desired hole.

Since the areas in which the inclination of hole should be considered are partially set in the second embodiment, the amount of data to be processed can be reduced to shorten the processing time period, compared with a case where the inclination of hole pattern must be calculated throughout the photomask.

Since the inclination of hole is further considered relative to marginal areas in which the holes are greatly affected by aberration, the holes in the marginal regions of the resist can be formed into circular configuration, as in the first embodiment.

Third Embodiment

Referring to FIGS. 9A–9D, there are shown four modifications in the third embodiment in which some square holes are stepwise inclined.

Figure 9A:
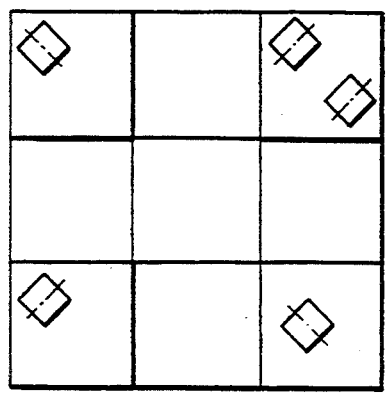
FIGS. 9A to 9D illustrate various modifications in the third embodiment of a photomask constructed in accordance with the present invention.

FIG. 9A is similar to FIG. 8C and shows a photomask which is divided into nine sections. Only holes formed in each of four corner sections in the photomask have sides each of which is inclined 45 degrees relative to the horizontal axis. Such a fixation of the inclination of hole enables the amount of data to be processed to be reduced greatly.

Figure 9B:
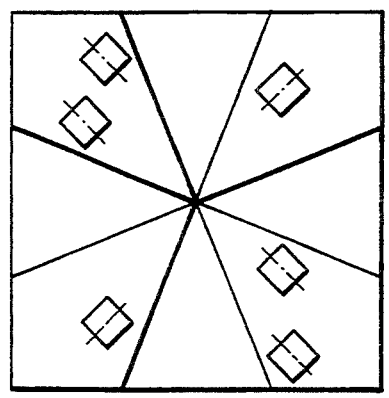
Figure 9C:
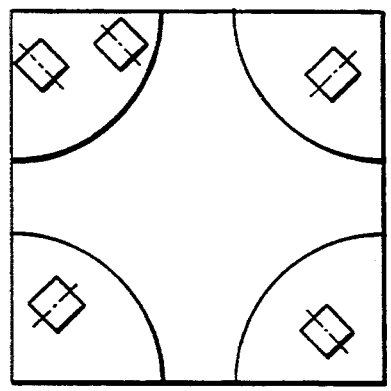
Figure 9D:
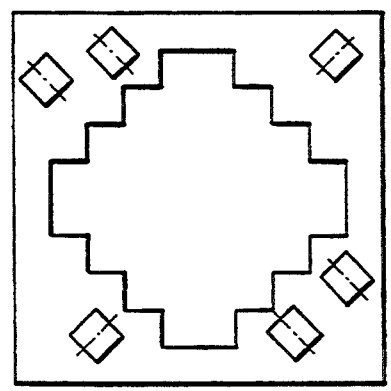
Figure 10A:
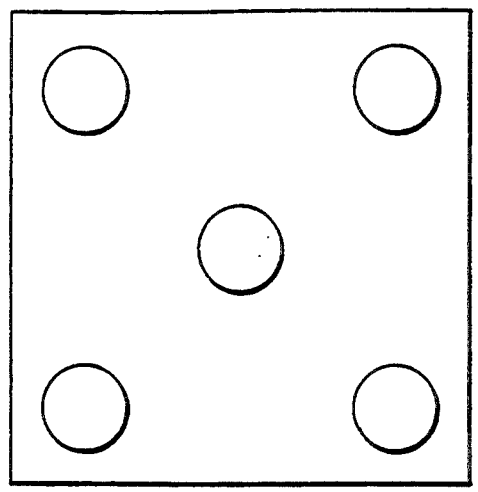
FIGS. 10A to 10C are diagrammatic views illustrating a conventional pattern of resist to be produced, a photomask for the resist pattern while dealing with the diffraction and patterns of resist formed by the use of the above photomask, respectively.
Figure 10B:
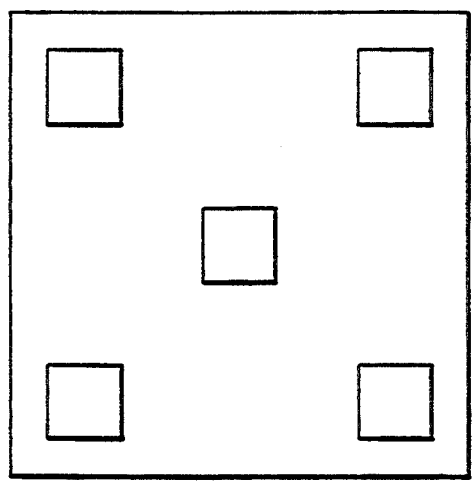
Figure 10C:
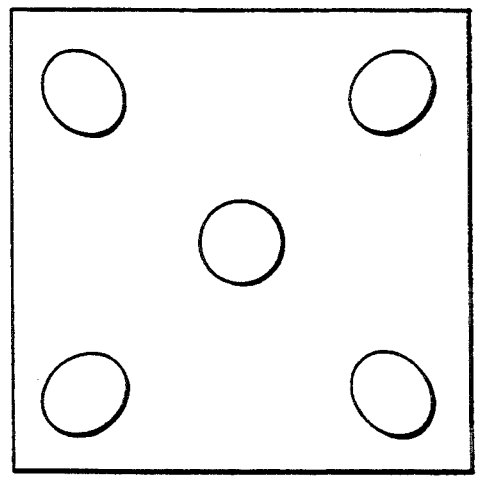

Similarly, FIGS. 9B to 9D correspond to FIGS. 8D to 8F, respectively. In the areas corresponding to the areas in which the sides of each of the holes are inclined along radial lines in the second embodiment shown in FIGS. 8A to 8F, the third embodiment provides a constant inclination of 45 degrees in the first and third quadrants and a constant inclination of 135 degrees in the second and fourth quadrants. Thus, the amount of data to be processed can greatly be reduced as in FIG. 8A.

Since the areas in which the inclination of holes should be considered are partially set and also the holes in each of these areas have sides each of which is inclined through a constant angle, the third embodiment can greatly reduce the amount of data to be processed to shorten the processing time, compared with cases where the inclination of holes must be considered throughout the photomask and where the sides of holes must continuously be inclined along radial lines.

The holes in the marginal regions of the resist can be formed into circular configuration, as in the first and second embodiments.

The present invention is not limited to the aforementioned forms, but may be carried out in various modifications without departing from the scope of the invention.

Although the third embodiment has been described as to the sides of the holes that are evenly inclined 45 degrees (or 135 degrees), an area in which the sides of the holes are to be inclined may be further subdivided into smaller sections in each of which an angle of inclination is independently set. For example, each of the quadrants in the photomask may be further subdivided into two smaller sections. In one of these two smaller sections, the sides of holes may be inclined 35 degrees. In the other smaller section, the sides of holes may be inclined 55 degrees. In such a case, the effect of aberration can further be reduced although the amount of data to be processed increases more than the third embodiment.

As will be apparent from the foregoing, the present invention sets the inclination in each of the sides of substantially square holes in the photomask so that these sides will belong to the tangential or sagittal plane of the lens. In such a manner, the affection of aberration due to the lens can be reduced to form holes in a semiconductor device with improved precision.

I claim:

1. A photomask for forming circular holes in a resist through an optical stepper, said photomask having holes of substantially square configuration at positions respectively corresponding to the circular holes, each of the sides of said substantially square holes being inclined to be parallel or perpendicular to a straight line connecting the center of said photomask located on the optical axis to the center of each of said substantially square holes so that a pair of facing sides of the substantially square holes align with a sagittal plane of the lens of the optical stepper and an opposing pair of sides of the substantially square holes align with a meridional plane of the lens of the optical stepper.

2. A photomask as defined in claim 1 wherein only some of the substantially square holes included in said photomask have inclined sides.

3. A photomask as defined in claim 2 wherein said substantially square holes having the inclined sides are located remotely from the center of said photomask located on said optical axis.

4. A photomask as defined in claim 2 wherein said substantially square holes having the inclined sides are a predetermined distance spaced away from the center of said photomask located on said optical axis.

5. A photomask as defined in claim 2 wherein said substantially square holes having the inclined sides are located adjacent to any straight line passing through the center of said photomask.

6. A photomask as defined in claim 2 wherein said substantially square holes having the inclined sides are inclined 45 degrees relative to any straight line passing through the center of said photomask.

7. A photomask as defined in claim 1 wherein each of said substantially square holes includes a pair of opposed sides extending substantially parallel to the straight line connecting the center of said photomask to the center of said substantially square hole, said pair of opposed sides being 0.8–1.0 times as long as another pair of opposed sides substantially perpendicular to said straight line.

8. A photomask as defined in claim 2 wherein each of said substantially square holes includes a pair of opposed sides extending substantially parallel to the straight line connecting the center of said photomask to the center of said substantially square hole pattern, said pair of opposed sides being 0.8–1.0 times as long as another pair of opposed sides substantially perpendicular to said straight line.

9. A process of making a semiconductor device by the use of a photomask for forming circular holes in a resist through an optical stepper, said photomask having holes of substantially square configuration at positions respectively corresponding to the circular holes, the process comprising the step of inclining each of the sides of said substantially square holes to be parallel or perpendicular to a straight line connecting the center of the photomask located on the optical axis to the center of each of said substantially square holes so that a pair of facing sides of the substantially square holes align with a sagittal plane of the lens of the optical stepper and an opposing pair of sides of the substantially square holes align with a meridional plane of the lens of the optical stepper.

10. A photomask for forming circular holes in a resist through an optical stepper, said photomask having holes of substantially square configuration at positions respectively corresponding to the circular holes, each of the sides of said substantially square holes being stepwise inclined to be substantially parallel or perpendicular to a straight line connecting the center of said photomask located on the optical axis to the center of each of said substantially square holes so that a pair of facing sides of the substantially square holes align with a sagittal plane of the lens of the optical stepper and an opposing pair of sides of the substantially square holes align with a meridional plane of the lens of the optical stepper.

11. A photomask as defined in claim 10 wherein the sides of said substantially square holes are inclined by a constant angle, the inclination of the line connecting the center of the photomask located on the optical axis to the center of each or said substantially square holes being within predetermined range.

12. A photomask as defined in claim 11 wherein only some of the substantially square holes included in said photomask have inclined sides.

13. A photomask as defined in claim 12 wherein said substantially square holes having the inclined sides are located remote from the center of said photomask located on said optical axis.

14. A photomask as defined in claim 12 wherein said substantially square holes having the inclined sides are located spaced away from the center of salad photomask located on said optical axis beyond a predetermined distance.

15. A photomask as defined in claim 12 wherein said substantially square holes having the inclined sides are located adjacent to any straight line passing through the center of said photomask.

16. A photomask as defined in claim 12 wherein said substantially square holes having the inclined sides are inclined 45 degrees relative to any straight line passing through the center of said photomask.

17. A photomask as defined in claim 10 wherein each of said substantially square holes includes a pair or opposed sides extending substantially parallel to the straight line connecting the center of said photomask to the center of said substantially square hole, said pair of opposed sides being 0.8–1.0 times as long as another pair of opposed sides substantially perpendicular to said straight line.

18. A photomask as defined in claim 11 wherein each of said substantially square holes includes a pair of opposed sides extending substantially parallel to the straight line connecting the center of said photomask to the center of said substantially square hole pattern, said pair of opposed sides being 0.8–1.0 times as long as another pair of opposed sides substantially perpendicular to said straight line.

19. A photomask as defined in claim 12 wherein each of said substantially square holes includes a pair of opposed sides extending substantially parallel to the straight line connecting the center of said photomask to the center of said substantially square hole pattern, said pair of opposed sides being 0.8–1.0 times as long as another pair of opposed sides substantially perpendicular to said straight line.

20. A process of making a semiconductor device by the use of a photomask for forming circular holes in a resist through an optical stepper, said photomask having holes of substantially square configuration at positions respectively corresponding to the circular holes, the process comprising the steps of stepwise inclining each of the sides of said substantially square holes to be substantially parallel or perpendicular to a straight line connecting the center of the photomask located on the optical axis to the center of each of said substantially square holes so that a pair of facing sides of the substantially square holes align with a sagittal plane of the lens of the optical stepper and an opposing pair of sides of the substantially square holes align with a meridional plane of the lens of the optical stepper.

* * * * *